(12) United States Patent
Fontana et al.

(10) Patent No.: US 8,697,985 B2
(45) Date of Patent: Apr. 15, 2014

(54) PROTECTIVE FILM FOR A SOLAR CELL MODULE

(75) Inventors: Simonetta Antonella Fontana, Milan (IT); Claudio Adolfo Pietro Tonelli, Monza (IT)

(73) Assignee: Solvay Solexis, S.PA., Bollate MI (IT)

( * ) Notice: Subject to any disclaimer, the term of this patent is extended or adjusted under 35 U.S.C. 154(b) by 104 days.

(21) Appl. No.: 13/319,677

(22) PCT Filed: May 21, 2010

(86) PCT No.: PCT/EP2010/057022
§ 371 (c)(1),
(2), (4) Date: Nov. 9, 2011

(87) PCT Pub. No.: WO2010/136392
PCT Pub. Date: Dec. 2, 2010

(65) Prior Publication Data
US 2012/0060903 A1    Mar. 15, 2012

(30) Foreign Application Priority Data

May 25, 2009  (EP) .................................... 09160990

(51) Int. Cl.
*H02N 6/00*    (2006.01)
*H01L 31/042*    (2006.01)

(52) U.S. Cl.
USPC ....................................................... 136/251

(58) Field of Classification Search
USPC ....................................................... 136/251
See application file for complete search history.

(56) References Cited

U.S. PATENT DOCUMENTS

| | | | |
|---|---|---|---|
| 4,818,801 A * | 4/1989 | Rice et al. ..................... | 526/247 |
| 5,994,133 A | 11/1999 | Meijs et al. | |
| 6,225,367 B1 | 5/2001 | Chaouk et al. | |
| 2006/0252910 A1 | 11/2006 | Shirakawa et al. | |
| 2007/0179263 A1 | 8/2007 | Koh et al. | |
| 2009/0032088 A1 * | 2/2009 | Rabinowitz ................... | 136/251 |

FOREIGN PATENT DOCUMENTS

| | | |
|---|---|---|
| JP | 2002083989 A | 3/2002 |
| JP | 2003188394 A | 7/2003 |
| JP | 2003234483 A | 8/2003 |
| JP | 2003238762 A | 8/2003 |
| WO | WO 2005101466 A2 | 10/2005 |
| WO | WO 2007133235 A2 | 11/2007 |
| WO | WO2008005327 A2 | 1/2008 |

OTHER PUBLICATIONS

Priola, A, et al—"UV-curable systems containing perfluoropolyether structures: synthesis and characterisation", Macromolecular Chemistry and Physics, 1997, vol. 198, p. 1893-1907, Verlag, Zug, Svizzera; 15 pgs.

Chan G.Y.N., et al—"Approaches to improving the biocompatibility of porous perfluoropolyethers for ophthalmic applications", Biomaterials, 2006, vol. 27, n °8, p. 1287-1295, Elsevier Science Publishers, BV., Barking, GB; 9 pgs.

* cited by examiner

*Primary Examiner* — Ling Choi
*Assistant Examiner* — Catherine S Branch
(74) *Attorney, Agent, or Firm* — Osha Liang LLP

(57) ABSTRACT

The invention relates to a protective film for a solar cell module, to a process for manufacturing said protective film and to a solar cell module comprising said protecting film, and to a method for protecting a solar cell module comprising using of such protective film. The protective film comprises at least one layer comprising a perfluoropolyether (PFPE) polymer [polymer (F)], the polymer being obtainable by cross-linking a composition [composition (C)] comprising: a) at least one functional perfluoropolyether compound [compound (E)], the compound (E) comprising a (per)fluoropoly-alkylene chain [chain ($R_f$)], and at least one unsaturated moiety, the compound (E) being present in an amount included in the range of 10% to 95% wt with respect to composition (C); b) at least one nonfuorinated compound [compound (M)] having at least one unsaturated moiety, provided that the nonfluorinated compound (M) has at least two unsaturated moieties if compound (E) has one unsaturated moiety; and c) at least one crosslinking initiator.

14 Claims, No Drawings

PROTECTIVE FILM FOR A SOLAR CELL MODULE

CROSS-REFERENCE TO RELATED APPLICATIONS

This application is a U.S. national stage entry under 35 U.S.C. §371 of International Application No. PCT/EP2010/057022 filed May 21, 2010, which claims priority to European application No. 09160990.9 filed May 25, 2009, the whole content of this application being incorporated herein by reference for all purposes.

TECHNICAL FIELD

The invention relates to a protective film for a solar cell module, to a solar cell module comprising said protective film, to a process for producing said protective film and to the use of the same.

BACKGROUND ART

Solar cells are being intensively studied in recent years since they are able to generate clean renewable energy without causing an increase of atmospheric carbon dioxide or other dangerous green house gases and thus have a strongly positive influence on the climatic balance in the atmosphere. Solar cells can also partly replace nuclear energy generation which always entails hazardous risks.

A variety of solar cell modules for commercial and home appliances have been proposed. These solar cell modules are typically constructed as a layered structure including a packed interconnected assembly of photovoltaic elements, also known as solar cells. Said layered structure includes a substrate that can be for example made of metal or glass, a semiconductor active layer disposed on said substrate, and a transparent and/or conductive layer disposed on said semiconductor active layer. A protective means is also needed in a solar cell module, to protect it from heat, humidity and from any possible environmental exposure or risk during transport. Especially in the case that the substrate is opaque, said protective film has to be transparent in order to allow the solar light to reach the solar cell module active layer.

Said protective means conventionally comprises a top coat layer made of a transparent fluorine-containing polymer comprised of a fluororesin or of a fluororesin-containing composition; often, an encapsulating layer is used under the top coat layer, in direct contact with the photoactive element.

The use of fluoropolyether compounds in coating compositions is already known.

US2006/0252910 (ASAHI GLASS COMPANY, LTD) discloses a fluoropolyether compound useful as lubricant, surface modifier or surfactant in coating compositions.

US2007/0179263 (DAIKIN INDUSTRIES, LTD) discloses a ionic liquid aromatic material useful as lubricants, acid remover agents, electrolytes for dye-sensitized solar cells and actuator materials. The ionic lyquid type functional material contains an aromatic compound that has a fluorine containing ether chain.

WO08/005327 (LIQUIDIA TECHNOLOGIES INC) discloses a photovoltaic device including an encapsulation layer fabricated from an elastomeric material such as for example a PFPE having favorable optical properties, gas permeable, scratch resistant, conformable liquid material. The encapsulation layer may also include a structured surface having the purpose of manipulating and trapping light incident on the photovoltaic device.

However, a protective film for a solar cell module simultaneously ensuring good transparency to light radiation, chemical and oxidative resistance, water impermeability, perfect adhesion to different substrates, and providing at the same time excellent mechanical properties is highly desired.

As a matter of fact, fluoropolymer films known in the art have the drawback that mechanical stress on the film surface generates a haze effect that leads to a loss of the film transparency so that the operation of the solar cell is compromised. Since a solar cell module is normally exposed to a natural environment for a long time, it is mandatory that the material forming the protective film thereof has excellent hardness, abrasion resistance and impact strength so that it can protect the solar cell from any possible event and particularly from the elements (rain, hail, wind, sand, etc).

Moreover, some of the fluoropolymer protective films known in the art require either the use of adhesives or particular treatments in order to ensure their bonding to the solar cell.

DISCLOSURE OF THE INVENTION

It is therefore an object of the present invention to provide a protective film for solar cell modules, having suitable insulation capacities, chemical and oxidative resistance, good adhesion to the photovoltaic element and excellent mechanical properties, which protects the photovoltaic element from any kind of mechanical stress for a long time, so that the operation of the solar cell module can be guaranteed in any environment.

The protective film according to the present invention comprises at least one layer comprising a perfluoropolyether (PFPE) polymer [polymer (F)], said polymer being obtainable by cross-linking a composition [composition (C)] comprising:

at least one functional perfluoropolyether compound [compound (E)], said compound (E) comprising a (per)fluoropolyalkylene chain [chain ($R_f$)], and at least one unsaturated moiety, said compound (E) being present in an amount of 10% to 95% wt;

at least one nonfuorinated compound (M) having at least one unsaturated moiety, provided that said nonfluorinated compound (M) has at least two unsaturated moieties if compound (E) comprises only one unsaturated moiety; and at least one crosslinking initiator.

By virtue of the particular formulation of composition (C), which comprises not only a perfluoropolyether compound (compound (E)) but also a nonfluorinated compound (compound (M)) crosslinked with said perfluoropolyether compound, the protective film according to the present invention possesses not only the fluoropolymer typical properties of a good transparency, good chemical and oxidative resistance, moisture barrier property, and a good adhesion to different substrates, but also excellent mechanical properties which ensure that practically no deterioration of the transparency of the film will occur, no matter how severe the stress exerted on the solar cell surface in the entire life thereof.

Other objects of the invention are a solar cell module comprising said protecting film, a process for producing said protective film and the use of the same.

The amount of compound (E) and of the nonfluorinated compound (M) are particularly critical, as only in the claimed range it is possible to obtain suitable mechanical and optical properties.

Thus, compound (E) is present in the curable composition (C) in an amount of 10% to 95% wt, with respect to composition (C). According to an embodiment of the invention, said amount is comprised between 20% and 85% wt. According to another embodiment, it is comprised between 30% and 75% wt, with respect to composition (C).

In addition, the Applicant has found that by appropriate selection of the molecular weight of the chain $R_f$ of the compound (E) it is possible to obtain protective films which possess particularly advantageous mechanical properties.

It has thus been found that, for the purposes of the invention, the molecular weight of the chain $R_f$ may be comprised between 500 and 4000. According to an embodiment of the invention, said molecular weight is comprised between 1200 and 3000. According to another embodiment, said molecular weight is comprised between 1500 and 2500.

The term "(per)fluoropolyoxyalkylene chain (chain $R_f$)" is hereby intended to denote a chain comprising recurring units (R1), said recurring units having general formula: —$(CF_2)_k$—CFZ—O—, wherein k is an integer of from 0 to 3 and Z is selected between a fluorine atom and a $C_1$-$C_5$ perfluoro(oxy)alkyl group.

Chain $R_f$ preferably complies with formula:

wherein Y is a $C_1$-$C_5$ perfluoro(oxy)alkyl group, z is 1 or 2; and p, q, r, s, t are integers ≥0, which may be selected such that the molecular weight of said chain $R_f$ complies with above mentioned requirements.

According to an embodiment of the invention, chain $R_f$ complies with formula:

wherein p' and q' are integers ≥0, selected such that the molecular weight of said chain $R_f$ complies with above mentioned requirements.

The molecular weight of said chain $R_f$ may be in the range between 1200 and 3500; according to a particular embodiment it may be between 1200 and 3000, according to another embodiment between 1500 and 3000, according to still another embodiment between 1500 and 2500; it is thus understood that in corresponding embodiments as above detailed p, q, r, s, t, p' and q' represent integers selected so as to comply with these molecular weight requirements.

Unsaturated moieties of the compound (E) are not particularly restricted provided that they possess a suitable reactivity in curing conditions.

Compound (E) may be selected among those of formula:

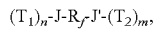

wherein $R_f$ represents a chain $R_f$ as above detailed; J and J', equal to or different from each other, are independently a bond or a divalent, trivalent or tetravalent bonding group; n, m are integers from 1 to 3; and $T_1$ and $T_2$, equal to or different from each other, are selected from the group consisting of:

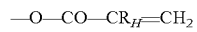

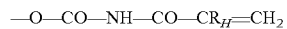

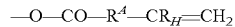

wherein $R_H$ is H or a $C_1$-$C_6$ alkyl group; $R^A$ is selected from the group consisting of:

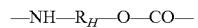

(jj)

$R^B$, $R^{B'}$, equal or different from each other, being independently divalent, polyvalent (e.g. trivalent or tetravalent) bonding groups selected from the group consisting of $C_1$-$C_{20}$ aliphatic group, $C_5$-$C_{40}$ cycloaliphatic group, $C_6$-$C_{50}$ aromatic, alkylaromatic or heteroaromatic group.

Groups J and J' can be any straight or branched organic bonding group. According to an embodiment, such groups are selected among divalent, trivalent or tetravalent (fluoro)hydrocarbon ether groups having 1 to 10 carbon atoms; or 1 to 6 carbon atoms according to a more specific embodiment. The presence of a bonding group having a valency of 3 or 4 results in a branched compound (E), having 3 to 6 terminal groups $T_1$ and $T_2$ and a corresponding number or reactive sites for the curing reaction.

Among compounds (E), mention can be made of:
acrylate derivatives of formula:

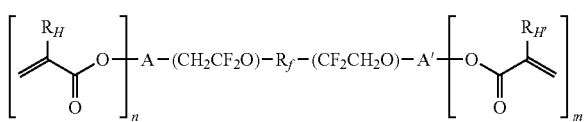

wherein n and m are integers from 1 to 3; A and A', equal or different from each other, are independently a bond or a divalent, trivalent or tetravalent bonding group; $R_f$ represents a chain as above detailed and $R_H$, $R_{H'}$ equal or different from each other, are independently H or a $C_1$-$C_6$ alkyl group;

(2) acrylamide-urea derivatives of formula:

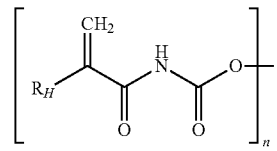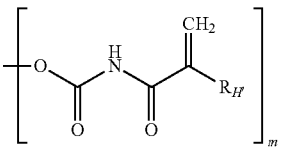

wherein n and m, A and A', $R_f$, $R_H$, $R_{H'}$ and $R_f$ have the same meaning as above detailed;

(3) acrylate-urethane derivatives of formula:

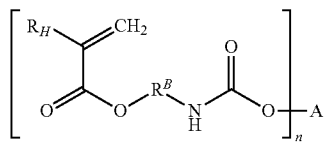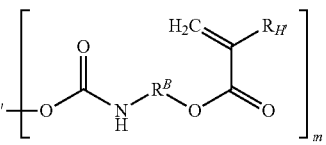

wherein n and m, A and A', $R_f$, $R_H$, $R_{H'}$, have the same meaning as above detailed; and each of $R^B$, equal to or different from each other, is a divalent, trivalent or tetravalent group selected from the group consisting of $C_1$-$C_{20}$ aliphatic group, $C_5$-$C_{40}$ cycloaliphatic group, $C_6$-$C_{50}$ aromatic, alkylaromatic or heteroaromatic group;

(4) urethane-amide-acrylate derivatives of formula:

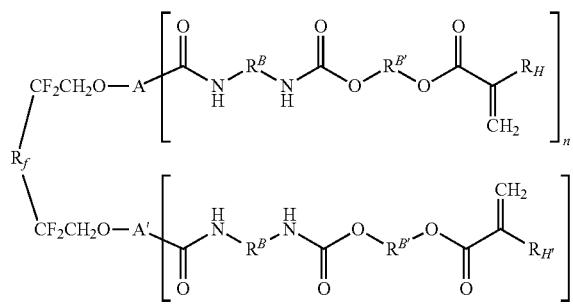

wherein n and m, A and A', $R_f$, $R_H$, $R_{H'}$, $R^B$ have the same meaning as above detailed; and each of $R^{B'}$, equal to or different from each other, is a divalent, trivalent or tetravalent group selected from the group consisting of $C_1$-$C_{20}$ aliphatic group, $C_5$-$C_{40}$ cycloaliphatic group, $C_6$-$C_{50}$ aromatic, alkylaromatic or heteroaromatic group.

Non limitative examples of compounds (E) which have been found particularly useful to the purposes of the present invention are notably:

H$_2$C=C(CH$_3$)
COOCH$_2$CH$_2$NHCOOCH$_2$R$_f$CH$_2$OCONHCH$_2$CH$_2$OC
OC(CH$_3$)=CH$_2$ wherein $R_f$ is a —CF$_2$O(CF$_2$CF$_2$O)$_{p'}$(CF$_2$O)$_{q'}$CF$_2$— chain,

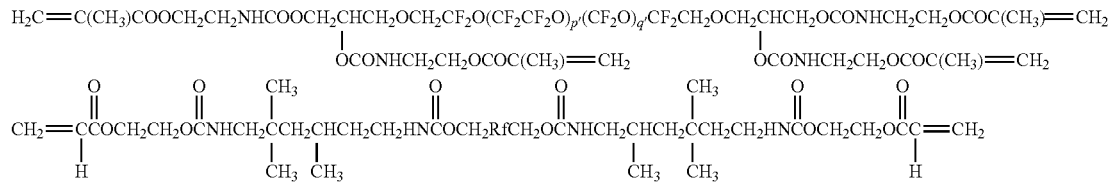

wherein Rf is a —CF$_2$O(CF$_2$CF$_2$O)$_{p'}$(CF$_2$O)$_{q'}$CF$_2$— chain,

A-NHCOOCH$_2$CF$_2$(CF$_2$O)$_{p'}$(CF$_2$CF$_2$O)$_{q'}$
CF$_2$CH$_2$OCONH-A wherein:

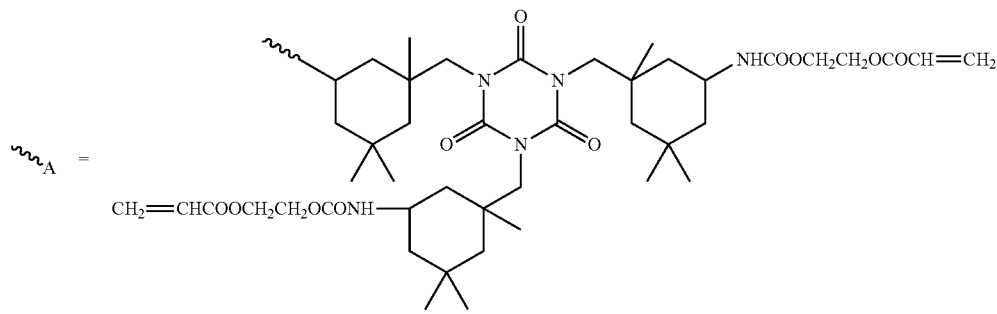

wherein, in each of above formulae p' and q' are selected so that the molecular weight of chain $R_f$ as above detailed is more than 500 and less than 4000, preferably is comprised between 1200 and 3000, more preferably between 1500 and 2500.

Compound (M) is present in the curable composition from which polymer (F) is obtained, in an amount of 5% to 90% wt. According to an embodiment of the invention, said amount is comprised between 15% and 80% wt; according to another embodiment it is comprised between 25% and 70% wt.

Compound (M) may comprise a wide variety of monomers or oligomers which are co-curable with compound (E). The co-curable compound (M) may have one, two or more polymerisable ethylenically unsaturated bonds which are capable of polymerisation. Typically, said compound (M) may comprise one or more of (meth)acryloyl functions. In the present description and in the claims, (meth)acryloyl function is intended to indicate a methacryloyl function or an acryloyl function.

Compound (M) may be for example selected among non-fluorinated compounds bearing the functional moiety represented in the following formula:

—O—C(O)—CR$_h^1$=CR$_h^2$R$_h^3$ wherein $R_h^1$, $R_h^2$ and $R_h^3$ are nonfluorinated $C_1$-$C_{10}$ aliphatic group, aliphatic $C_1$-$C_{10}$ silane group, $C_5$-$C_{14}$ cycloaliphatic group, $C_5$-$C_{14}$ cycloaliphatic silane group, $C_6$-$C_{14}$ aromatic or alkylaromatic group.

Monofunctional, difunctional, tri- or multifunctional derivatives can be used, although it must be noted that, in order to ensure a suitable grade of cross-linking between compound (E) and compound (M), it is necessary that compound (M) comprises at least two unsaturated moieties if compound (E) has only one unsaturated moiety.

Representative examples of the monofunctional (meth)acrylates are (3-methacryloxypropyl)trimethoxysilane, (3-methacryloxypropyl)dimethylmethoxy silane, (3-acryloxypropyl)-trimethoxysilane, 2-hydroxyethyl-(meth)acrylate, 2-hydroxypropyl-(meth)acrylate, 2-hydroxybutyl-(meth)acrylate, 1-hydroxybutyl-(meth)acrylate, 2-hydroxy-3-phenyloxypropyl(meth)acrylate, tetrahydro-furfuryl-(meth)acrylate, isodecyl-(meth)acrylate, 2-(2- ethoxyethoxy)-ethyl-(meth)acrylate, stearyl(meth)acrylate, lauryl(meth)acrylate, 2-phenoxyethyl(meth)acrylate, isobornyl(meth)acrylate, tridecyl(meth)acrylate, polycaprolactone(meth)acrylate, phenoxytetraethyleneglycol-(meth)acrylate and imide-acrylate.

The difunctional (meth)acrylate which may be employed in the present invention may be ethoxylated-nonylphenol (meth)acrylate, ethylene glycol di(meth)acrylate, diethylene glycol di(meth)acrylate, triethylene glycol di(meth)acrylate, tetraethylene glycol di(meth)acrylate, polyethylene glycol di(meth)acrylate, 1,6-hexanediol di(meth)acrylate, 1,3-butylene glycol di(meth)acrylate, tripropylene glycol di(meth)acrylate, ethoxylated bisphenol A di(meth)acrylate, cyclohexane dimethanol di(meth)acrylate.

Examples of the tri- or multi-functional (meth)acrylate are tris[2-(acryloyloxy)ethyl]isocyanurate, trimethylol propane triacrylate, ethylene oxide added trimethylol propane triacrylate, pentaerythritol triacrylate, tris(acrylooxyethyl)isocyanurate, dipentaerythritol hexaacrylate and caprolactone denatured dipentaerythritol hexaacrylate.

Good results have been obtained with the following compounds (M): 1,6-esandiol diacrylate, trimethylolpropane tri(meth)acrylate, tripropylene glycol di(meth)acrylate, tetrahydrofurfuryl(meth)acrylate, 3-(meth)acryloxypropyl trimethoxysilane, acrylic acid, dipentaerithrol hexaacrylate.

The composition (C) useable for obtaining the protective film according to the invention also generally contains a crosslinking initiator, which may be a photoinitiator or a thermal initiator, for example an organic peroxide. Nevertheless, the curing agent is preferably a photoinitiator and it may be selected in the group consisting of following families: alpha-hydroxyketones; phenylglyoxylates; benzyldimethylketals; alpha-aminoketones; and bis acyl-phosphines.

Among alpha-hydroxyketones, mention can be made of 1-hydroxy-cyclohexyl-phenyl-ketone; 2-hydroxy-2-methyl-1-phenyl-1-propanone; and 2-hydroxy-1-[4-(2-hydroxyethoxy)phenyl]-2-methyl-1-propanone.

Among phenylglyoxylates, mention can be made of methylbenzoylformate; oxy-phenyl-acetic acid 2-[2-oxo-2-phenyl-acetoxy-ethoxy]-ethyl ester, and oxy-phenyl-acetic 2-[2-hydroxy-ethoxy]-ethyl ester.

As benzyldimethyl-ketals, alpha, alpha-dimethoxy-alpha-phenylacetophenone can be mentioned.

Among alpha-aminoketones, mention can be made of 2-benzyl-2-(dimethylamino)-1-[4-(4-morpholinyl)phenyl]-1-butanone, and 2-methyl-1-[4-(methylthio)phenyl]-2-(4-morpholinyl)-1-propanone;

Among bis acyl-phosphines, mention can be made of diphenyl-(2,4,6-trimethylbenzoyl)-phosphine oxide.

Among photoinitiators, those which are liquid at room temperature are preferred.

A class of photoinitiators which gave particularly good results has been that of alpha-hydroxyketones, in particular 2-hydroxy-2-methyl-1-phenyl-1-propanone.

The amount of photoionitiator is not particularly limited. Generally, it will be used in an amount included between 0.01% wt and 3% wt with respect to the weight of the composition (C). According to an embodiment of the invention, said amount may be in the range of 0.5% wt and 1% wt.

Also, since residues of the photoinitiator may impair the resulting polymer composition, it is generally preferred to minimize the amount thereof as much as possible. Thus, said photoinitiator is generally used in an amount of at most 10% wt, preferably at most 7.5% wt, more preferably at most 5% wt, with respect to the weight of the composition (C).

The composition (C) might possibly comprise further additives and ingredients, provided that they do not interfere with light transmission.

Light stabilizers, e.g. HALS, UV adsorbers, leveling agents, adhesion promoters may be also used. The total amount of these additives, if present, is preferably comprised between 5% and 10% wt.

Fillers such as inorganic oxides e.g. silica, $TiO_2$, ITO can improve adhesion to the cell and moisture vapour and gas barrier properties. Typically, primary particles of filler having diameter of no more than approximately one fifth of the visible light wavelength (e.g. particles having diameter of less than 100 nm) do not contribute significantly to light scattering. Thus, the above mentioned fillers may be used as particles having average size of less than 100 nm.

It is nevertheless generally understood that compound (E) and compound (M) are the major components of the composition (C); minor amounts of other components might be present to the extent that they do not modify properties of said compounds.

The invention also relates to a process for manufacturing a protective film comprising at least one layer comprising polymer (F).

The process comprises:
providing a composition (C) as above detailed,
depositing the composition (C) on a substrate,
crosslinking said composition (C).

The composition typically comprises a crosslinking initiator as above described. The composition (C) is suitably used in an amount sufficient for obtaining a protective film of the desired thickness. According to an embodiment of the invention, the protective film according to the invention has a thickness of at least 15 μm; according to another embodiment said thickness is at least 20 μm, according to still another embodiment it is of at least 25 μm. According to an embodiment of the invention, said film has a thickness of at most 250 μm, according to another embodiment said thickness is at most 200 μm, according to still another embodiment it is of at most 150 μm.

Deposition of the composition on a suitable substrate may be accomplished by any appropriate deposition technique, including casting, spin-coating, extrusion moulding, film-blowing and the like. The substrate may be for example a metal or polymeric substrate. According to a preferred embodiment of the invention, the composition is directly deposited on the surface of the photovoltaic element which is to be protected.

In step (c) the substrate on which composition (C) has been deposited is submitted to UV radiation, in the case that a photoinitiator is used, or heated, in the case that a thermal initiator is used.

Among sources of UV radiations which can be used, mention can be made of mercury lamps, xenon arc lamps (commonly used as sunlight simulators), deuterium arc lamps, mercury-xenon arc lamps, metal-halide arc lamps, and tungsten-halogen incandescent lamps.

Radiation dose will be adjusted by the skilled in the art as a function of the type and concentration of photoinitiator; generally, good results have been obtained with radiation doses of at least 2 $J/cm^2$, preferably 5 $J/cm^2$.

For achieving improved curing rates and minimizing degradation reactions, composition (C) may be submitted to UV radiations under a substantially oxygen-free atmosphere. Typically, step (c) will be carried out under nitrogen atmosphere.

The invention also relates to a solar cell module comprising at least one photovoltaic element and a protective film as above defined.

The photovoltaic elements of the solar cell module of the invention are well known to those skilled in the art; said photovoltaic element is generally formed of a semiconductor photoactive layer (i.e. the layer endowed of photoelectric conversion property) sandwiched between an electroconductive substrate and a transparent conductive layer.

The electroconductive substrate serves as a base member for the photovoltaic element as well as a lower-side electrode. Examples of materials thereof include silicon, tantalum, molybdenum, tungsten, stainless steel, aluminium, copper, titanium, carbon sheet, lead-plated steel, and resin films, and ceramics and glass having an electroconductive layer formed thereon. On the above electroconductive substrate, a backside reflection layer may be formed from a metal layer, a metal oxide layer, or a lamination thereof. The metal layer can be formed from Ti, Cr, Mo, W, Al, Ag, Ni, Cu, and the like. The metal oxide layer can be formed from $ZnO$, $TiO_2$, $SnO_2$, $In_2O_3$—$SnO_2$ (ITO), and the like. The metal layer and the metal oxide layer may be formed by resistance heating vapor deposition, electron beam vapor deposition, sputtering, or like method.

The semiconductor photoactive layer is intended to perform photovoltaic conversion. The specific materials used for forming such semiconductor photoactive layer include single crystal silicon semiconductor, non-single crystal silicon semiconductor (e.g. an amorphous silicon (a-Si) semiconductor or a polycrystalline silicon semiconductor), compound semiconductors and junctions such as $CuInSe_2$, $CuInS_2$, GaAs, CdS/Cu2S, CdS/CdTe, CdS/InP, and $CdTe/Cu_2Te$, and organic semiconductors such as polymers and small-molecule compounds like polyphenylene vinylene, copper phthalocyanine (a blue or green organic pigment) and carbon fullerenes.

The semiconductor photoactive layer formed of either of the above semiconductor has generally a laminated structure with a "pn junction", "pin junction" or Schottky junction.

A transparent electroconductive layer serves as an upper-side electrode (i.e. the light receiving surface). Specific examples of the material therefore include $In_2O_3$, $SnO_2$, $In_2O_3$—$SnO_2$ (ITO), $ZnO$, $TiO_2$, $Cd_2SnO_4$, crystalline semiconductor layers doped with a high concentration of an impurity, like notably fluorine-doped tin oxide ($SnO_2$:F, or "FTO"), doped zinc oxide (e.g.: ZnO:Al) and flexible organic conductors, like, e.g. carbon nanotube networks embedded in a transparent polymer matrix.

The layer may be formed by resistance-heating vapor deposition, sputtering, spraying, chemical vapour deposition (CVD), impurity diffusion, and like methods. In case of flexible organic conductors, typical polymer processing technologies are also available, including laminating, casting, extrusion and the like.

On the transparent electroconductive layer, a grid type collecting electrode (grid) may be provided in order to efficiently collect the generated current. Specific examples of the material for the collecting electrode include Ti, Cr, Mo, W, Al, Ag, Ni, Cu, Sn, and alloys thereof, and an electroconductive paste such as silver paste. The collecting electrode may be formed by sputtering, resistance heating, and CVD employing a mask pattern; metal film deposition and subsequent etching for patterning; direct grid electrode pattern formation by photo-assisted CVD; formation of a negative pattern mask of the grid electrode and subsequent metal plating; printing with electroconductive paste, bonding of metal wires, and like methods. The electroconductive paste generally includes a dispersion of powder of silver, gold, copper, nickel, carbon or the like in a polymeric binder. The polymeric binder includes polyester resins, epoxy resins, acrylic resins, alkyd resins, polyvinyl acetate resins, rubbers, urethane resins, and phenol resins. Otherwise, a wire made of a metal such as Cu may be provided on the transparent conductive layer.

Solar cell module is generally equipped with output terminals for extracting photovoltaic current. Said output terminals are typically in electric connection with the conductive substrate and the collecting electrode, respectively. Generally a metal piece such as a copper tab can be used as output terminal at the conductive substrate side, connected to the conductive substrate by spot welding or soldering. On the other hand, a metal may be electrically connected to the collecting electrode by means of conductive paste or solder.

A plurality of solar cell modules as above detailed may be provided, wherein photovoltaic elements can be connected in series or in parallel according to the desired voltage or current.

The back layer is intended for maintaining electric insulation between the conductive substrate of the photovoltaic element and the exterior. The back layer is generally made of a flexible material which ensures sufficient electric insulation with the conductive substrate of the photovoltaic element.

It is preferred that the back layer comprises, preferably consist essentially of a fluoropolymer compatible with polymer (F).

The protective film of the solar cell module according to the invention may comprise at least 50% wt of polymer (F). According to an embodiment, said amount of polymer (F) is at least 70% wt, according to another embodiment is of at least 90% wt.

Nevertheless, the protective film may consist essentially of polymer (F), that is to say that even if other layers are present, they do not substantially change advantageous properties of the protective film according to the invention.

Thickness of the protective film is not particularly limited, provided that suitable insulation and mechanical protection is guaranteed to the photovoltaic element.

Should the disclosure of any patents, patent applications, and publications which are incorporated herein by reference conflict with the description of the present application to the extent that it may render a term unclear, the present description shall take precedence.

The invention will be now described with reference to the following examples, whose purpose is merely illustrative and not intended to limit the scope of the invention.

PREPARATIVE EXAMPLE 1

Synthesis of a Functional PFPE Compound (E1)

120.1 g of $HOCH_2CF_2O(CF_2CF_2O)_{p'}$ $(CF_2O)_{q'}CF_2CH_2OH$ marketed by Solvay Solexis under the trade name Fluorolink® 10-H (Molecular Weight MW=1507; p'/q'=1.8 number average functionality 1.96; 156 meq); where p' and q' are as above detailed;

3 ml of a methyl ethyl ketone (MEK) solution of dibutyl tin dilaurate (DBTDL);

and 24.3 g of ethylisocyanate methacrylate (EIM) (MW=156; 156 mmol) are reacted accordingly to synthesis description reported in Macromol. Che. Phys. 198, 1893-1907 (1997).

The following expected compound (E1), as confirmed by [19]NMR and FTIR analysis, was obtained:

$H_2C$=$C(CH_3)COOCH_2CH_2NHCOOCH_2CF_2O$
$(CF_2CF_2O)_{p'}(CF_2O)_{q'}$
$CF_2CH_2OCONHCH_2CH_2OCOC(CH_3)$=$CH_2$

Physical chemical data of compound (E1) are given in Table 1.

PREPARATIVE EXAMPLE 2

Synthesis of a Functional PFPE Compound (E2)

The same procedure as in example 1 was used, with the exception that 113.4 g of (HO)CH$_2$CH(OH)CH$_2$OCH$_2$CF$_2$O(CF$_2$CF$_2$O)$_{p'}$(CF$_2$O)$_{q'}$CF$_2$CH$_2$OCH$_2$CH(OH)CH$_2$OH marketed by Solvay Solexis under the trade name Fomblin® Z Tetraol (MW=1827; p'/q'=1.9; number average functionality 3.8; 235 meq) was used as hydroxyl PFPE precursor, and 36.6 g of ethylisocyanate methacrylate (EIM) (MW=156; 235 mmol) were used. 146.4 g were obtained of a functional compound (E2) complying with the following formula, wherein p' and q' are as above detailed, as confirmed by $^{19}$NMR and FTIR analysis.

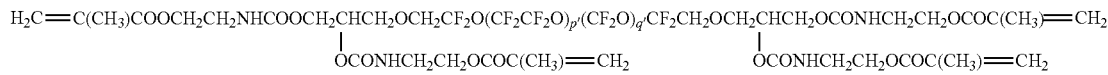

Physical chemical data of compound (E2) are given in Table 1.

PREPARATIVE EXAMPLE 3

Synthesis of a Functional PFPE Compound (E3)

In a 500 ml round flask equipped with mechanical stirrer, dropping funnel and refrigeration column, the following reagents were charged under inert atmosphere and the temperature is raised up to 40° C.:
1. 100.5 g of HOCH$_2$CF$_2$O(CF$_2$CF$_2$O)$_{p'}$(CF$_2$O)$_{q'}$CF$_2$CH$_2$OH Fluorolink® 10-H (MW=1458; p'/q'=1.7 number average functionality 1.96; 135 meq); and
2. 28.6 g of trimethyl hexamethylene diisocyanate (TMDI) (Equivalent Weight, EW=106, 270 meq)

Then, 3 ml of a 5% solution of dibutyl tin dilaurate (DBTDL) in ethyl acetate was added and the reacting mixture was stirred for 2 hours by checking that the reaction temperature did not exceed 65° C. The conversion grade was monitored by means of $^{19}$NMR analysis, by observing the shifting of preterminal CF$_2$ carbon atoms signals from −81.3 and −83.3 ppm, when linked to —CH$_2$OH group, to −77.5 and −79.5 ppm when linked to the urethane moiety. The reaction mixture was cooled at about 50° C. and 15.7 g of hydroxyethyl acrylate (HEA) (MW=116, 135 mmol) were slowly dropped at a rate such that the temperature of the reacting mixture did not exceed 60° C. When dropping was completed, the reacting mixture was stirred for more 6 hours and the conversion grade was monitored by FTIR analysis, by monitoring disappearance of the 2250 cm$^{-1}$ isocyanate absorption band, which at the end of the reaction was under the analytical limit. The resulting product was then additioned with 200 ppm of 2,6-di-tert-buthyl-4-methylphenol (BHT) stabilizer and stripped under vacuum (1 mBar) at 60° C. for about 30'. 142.8 g of a functional compound (E3) were recovered, which, as confirmed by $^{19}$NMR and FTIR analysis, were found to comply with the formula herein below:

wherein Rf is a —CF$_2$O(CF$_2$CF$_2$O)$_{p'}$(CF$_2$O)$_{q'}$CF$_2$— chain, wherein p' and q' are as above detailed.

Physical chemical data of compound (E3) are given in Table 1.

PREPARATIVE EXAMPLE 4

Synthesis of a Functional PFPE Compound (E4)

In a 500 ml round flask equipped with mechanical stirrer, dropping funnel and refrigeration column, 95 g of ethyl acetate and 100.1 g of isophorone diisocyanate marketed by Evonik-Degussa under the trade name Vestanat® 1890/100 (EW=245; 408 meq) were charged under inert atmosphere and the temperature was raised up to 50° C. Stirring was continued until a limpid solution was obtained. Then, 3 ml of a 5% solution of dibutyl tin dilaurate (DBTDL) in ethyl acetate were added and 34.2 ml of hydroxyethyl acrylate (HEA) (MW=116, 292 mmol) were slowly dropped at a rate such that the temperature of the reacting mixture did not exceed 60° C. When dropping was completed, the reacting mixture was stirred for 1 more hour at 60° C. and the reaction check was performed by NCO titration. This first reaction was considered completed when the value of the residue NCO was about 28% of the equivalents of charged Vestanat 1890/100.

Then, 85.5 g of HOCH$_2$CF$_2$O(CF$_2$CF$_2$O)$_{p'}$(CF$_2$O)$_{q'}$CF$_2$CH$_2$OH Fluorolink® 10-H (MW=1458; p'/q'=1.7 number average functionality 1.96; 115 meq) were added to the reaction mixture and vigorously stirred for about 20 hours. The conversion grade was monitored both by FTIR analysis, by monitoring disappearance of the 2250 cm$^{-1}$ isocyanate absorption band which, at reaction end, was under the analytical value, and by means of $^{19}$NMR analysis, by observing the shifting of preterminal CF$_2$ carbon atoms signals from −81.3 and −83.3 ppm, when linked to —CH$_2$OH group, to −77.5 and −79.5 ppm when linked to the urethane moiety. The resulting product was then additioned with 200 ppm of 2,6-di-tert-buthyl-4-methylphenol (BHT) stabilizer isolated through distillation of the reaction solvent at reduced pressure (0.1 mBar) at 60° C. 207.9 g of a functional compound (E4) were recovered, which, as confirmed by $^{19}$NMR and FTIR analysis, were found to comply with the formula herein below:

wherein:

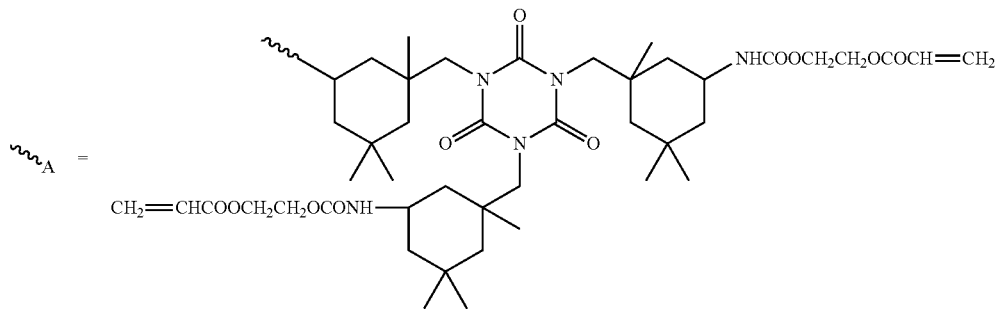

and p' and q' are as above detailed.

Physical chemical data of compound (E4) are given in Table 1.

TABLE 1

| PFPE compound | PFPE content (%) | (Meth)acrylic content (eq/kg) | Refraction index | Viscosity (cPs) |
|---|---|---|---|---|
| E1 | 83-85 | 1.1 | 1,342 | 430 (25° C.) |
| E2 | 76-80 | 1.6 | 1,383 | 8800 (40° C.) |
| E3 | 69-72 | 0.9 | 1,371 | 22000 (25° C.) |
| E4 | 37-40 | 1.3 | 1,401 | solid |

The functional PFPE compounds E1-E4 obtained in the preceding preparative examples 1 to 4 were then formulated with different nonfluorinated compounds (M). The following compounds were used as nonfluorinated compounds (M):

1,6-hexane diol diacrylate (HDDA)
trimethylolpropane triacrylate (TMPTA)
tripropylene glycol diacrylate (TPGDA)
tetrahydrofurfuryl acrylate (THFA)
3-methacryloxypropyl trimethoxysilane (Dynasilan memo)
acrylic acid

EXAMPLE 5

Preparation of Composition C1

In a dark glass container equipped with mechanical stirrer, 15 g of E3, 3 g of 1,6-hexane diol diacrylate (HDDA) and 2 g of trimethylolpropane triacrylate (TMPTA) were added in the given order, and it was stirred at 40° C. for about 10' until a homogeneous solution was obtained. Then, 0.5% (w/w) of 2-hydroxy-2-methyl-1-phenyl-1-propanone marketed by Ciba under the trade name Darocur® 1173 was added and stirred for about 30' until a homogeneous composition was obtained.

EXAMPLES 6-12

Preparation of Compositions C2-C8

Compositions C2-C8 were prepared according to the same procedure described in example 5. The amount of functional PFPE compounds E1-E4 and nonfluorinated compounds (M) used are indicated in the following Table 2.

EXAMPLE 13

Preparation of Film F1 from Composition C1 on a Chrome Aluminium Substrate (Q-Panel)

Composition C1 was deposited on a Q-panel by means of an automatic film applicator Elcometer 4340 Applicator provided with 30 µm bar and subjected to UV treatment by using a 13 mm H lamp (Fusion UV system Model VPS/1600) having maximum emission at 350 nm and maximum output of 240 w/cm. Completion of film crosslinking was monitored by FTIR-ATR by observing disappearance of the acrylic double bond absorption band at 1636 cm$^{-1}$, and the film thickness is checked through Exacto thickness gauge (Elektro Physik).

EXAMPLES 14-20

Preparation of Films F2-F8 from Compositions C2-C8 on Chrome Aluminium Substrates The same procedure as in Example 13 was used, to deposit and crosslink compositions C2-C8.

EXAMPLES 21-28

Preparation of Films F1-F8 from Compositions C1-C8 on PET Substrates

The same procedure as in Example 13 was used, to deposit and crosslink compositions C1-C8, with the exception that a PET substrate was used.

COMPARATIVE EXAMPLE 1

Preparation of Film CF9 on Chrome Aluminium Substrate

In a dark glass container equipped with mechanical stirrer, 30 g of a perfluoropolyether dimethacrylate (PFPE DMA) synthesized according to example 1 of WO 2005/101466, were additioned with 0.15 g of Darocur® 1173 and stirred for about 30' until a homogeneous comparative composition Comp. C9 was obtained.

A sample of composition Comp. C9 was deposited on a Q-panel by means of an automatic film applicator Elcometer 4340 Applicator provided with 30 µm bar and subjected to UV treatment by using a 13 mm H lamp (Fusion UV system Model VPS/1600) having maximum emission at 350 nm and maximum output of 240 w/cm. Completion of film crosslinking was monitored by FTIR-ATR by observing disappearance of the acrylic double bond absorption band at 1636 cm$^{-1}$, and the film thickness is checked through Exacto thickness gauge (Elektro Physik).

COMPARATIVE EXAMPLE 2

Preparation of Film CF9 on PET Substrate

The same procedure as in Comparative Example 2 was used, to prepare, deposit and crosslink composition Comp. C9, with the exception that a PET substrate was used.

COMPARATIVE EXAMPLE 3

Preparation of Film CF10 on Chrome Aluminium Substrate

In a dark glass container equipped with mechanical stirrer, 30 g of composition E1 and 0.15 g of Darocur® 1173 were introduced and stirred for about 30' until a homogeneous comparative composition Comp. C10 was obtained.
A sample of composition Comp. C10 was deposited on a Q-panel by means of an automatic film applicator Elcometer 4340 Applicator provided with 30 μm bar and subjected to UV treatment by using a 13 mm H lamp (Fusion UV system Model VPS/1600) having maximum emission at 350 nm and maximum output of 240 w/cm. Completion of film crosslinking was monitored by FTIR-ATR by observing disappearance of the acrylic double bond absorption band at 1636 cm$^{-1}$, and the film thickness is checked through Exacto thickness gauge (Elektro Physik).

COMPARATIVE EXAMPLE 4

Preparation of Film CF10 on PET Substrate

The same procedure as in Comparative Example 3 was used, to prepare, deposit and crosslink composition Comp. C10, with the exception that a PET substrate was used.
The following table 2 summarizes the constitution of compositions C1-C8 and comparative compositions Comp. C9 and C10.

ment according to method ASTM D 1003 by means of a Spherical Hazameter. The film supported by PET substrate is then subjected to a load of 1000 g with an abrasive wheel CS10 for 10 cycles and then again subjected to the Haze measurement. Table 3 shows the Haze values of the film before and after the abrasive treatment.

EXAMPLES 30-36

Taber Test ASTM D1044 of Films F2-F8 on PET Substrate

Films F2-F8 obtained in examples 22-28 by crosslinking compositions C2-C8 on PET substrates were subjected to the Taber test according to the same procedure as in example 29. Table 3 shows the Haze values of the films before and after the abrasive treatment.

COMPARATIVE EXAMPLE 5

Taber Test ASTM D1044 of Film CF9 on PET Substrate

Film CF9 obtained in comparative example 2 by crosslinking composition C9 on a PET substrate was subjected to the Taber test according to the same procedure as in example 29. Table 3 shows the Haze values of the film before and after the abrasive treatment.

COMPARATIVE EXAMPLE 6

Taber Test ASTM D1044 of Film CF10 on PET Substrate

Film CF10 obtained in comparative example 4 by crosslinking composition C10 on a PET substrate was subjected to the Taber test according to the same procedure as in example 29. Table 3 shows the Haze values of the film before and after the abrasive treatment.

TABLE 2

| | | Components (% w/w) | | | | | | | | | | | |
|---|---|---|---|---|---|---|---|---|---|---|---|---|---|
| Composition | Film | E1 | E2 | E3 | E4 | Florocur™ | HDDA | THFA | TMPTA | TPGDA | Acrylic acid | Dynasilan memo | % PFPE chain |
| C1 | F1 | | 75 | | | | 15 | | 10 | | | | 53 |
| C2 | F2 | | 75 | | | | 15 | 10 | | | | | 53 |
| C3 | F3 | | | 35 | | | 15 | 30 | 20 | | | | 13 |
| C4 | F4 | 23 | | | | | | | 23 | 54 | | | 20 |
| C5 | F5 | | 65 | | | | 15 | | 10 | | 5 | 5 | 45 |
| C6 | F6 | | 80 | | | | 20 | | | | | | 62 |
| C7 | F7 | | 75 | | | | 15 | | 10 | | | | 58 |
| C8 | F8 | | 75 | | | | 15 | 10 | | | | | 58 |
| Comp C9 | CF9 | | | | 100 | | | | | | | | 92 |
| Comp C10 | CF10 | 100 | | | | | | | | | | | 83 |

EXAMPLE 29

Taber Test ASTM D1044 of Film F1 on PET Substrate

The film obtained in example 21 by crosslinking composition C1 on a PET substrate was subjected to Haze measure-

COMPARATIVE EXAMPLE 7

Taber Test ASTM D1044 of a Film CF11

A 100 μm film made from a commercial ethylene chlorotrifluoroethlyene copolymer marketed by Solvay Solexis under the trade name Halar® 300LC (hereinafter named CF11) was subjected to Haze measurement according to method ASTM E 1300 by means of a Spherical Hazameter. The film was positioned and fixed on a rigid rubber support and then subjected to a load of 1000 g with an abrasive wheel CS10 for 10 cycles. The resulting film is then again subjected to the Haze measurement. Table 3 shows the Haze values of the film before and after the abrasive treatment.

COMPARATIVE EXAMPLES 8-11

Taber Test ASTM D1044 of Films CF12-15

100 μm films made from commercial polymers marketed by Solvay Solexis under the trade names Hyflon® PFA M640 (hereinafter named CF12), Hyflon® MFA 1041 (hereinafter named CF13); Hyflon® MFA F1540 (hereinafter named CF14) and a 100 μm film made from ethylene-tetrafluoroethylene marketed by Du Pont™ under the trade name Tefzel® (hereinafter named CF15) are subjected to Taber test according to the method described in comparative example 7. Table 3 shows the Haze values of the film before and after the abrasive treatment.

TABLE 3

| | | | Haze | |
|---|---|---|---|---|
| Tested Films | | | Before | After |
| Test Example | Composition | Film | treatment | treatment |
| Ex. 29 | C1 | Film* F1 | 2 | 16 |
| Ex. 30 | C2 | Film* F2 | 2 | 15 |
| Ex. 31 | C3 | Film* F3 | 1 | 19 |
| Ex. 32 | C4 | Film* F4 | 1 | 16 |
| Ex. 33 | C5 | Film* F5 | 3 | 25 |
| Ex. 34 | C6 | Film* F6 | 3 | 25 |
| Ex. 35 | C7 | Film* F7 | 3 | 15 |
| Ex. 36 | C8 | Film* F8 | 2 | 16 |
| Comp. Ex. 5 | Comp C9 | Film* CF9 | 0 | 43 |
| Comp. Ex. 6 | Comp. C10 | Film* CF10 | 1 | 41 |
| Comp. Ex. 7 | Halar® 300LC | Film# CF11 | 17 | 35 |
| Comp. Ex. 8 | Hyflon® PFA M640 | Film# CF12 | 3 | 36 |
| Comp. Ex. 9 | Hyflon® MFA 1041 | Film# CF13 | 7 | 37 |
| Comp. Ex. 10 | Hyflon® MFA F1540 | Film# CF14 | 4 | 33 |
| Comp. Ex. 11 | Tefzel® | Film# CF15 | 5 | 31 |

*= 30 μm;
100 μm

The results of the Taber tests show that films F1-F8 according to the present invention have a particularly increased resistance to abrasion with respect to comparative fluoropolymers. The good performance of the inventive films is obviously due to the presence of both crosslinked components (E) and (M), as it is demonstrated by comparison with the performance of film CF10 which only comprises a crosslinked perfluoropolyether compound (M).

EXAMPLE 37

Pencil Hardness Test of the F1 Film

Film F1 obtained in example 13 on a chrome aluminium substrate is subjected to the pencil hardness test with a Gardco® tester according to the procedure explained in "Paint Testing Manual", Gardner, Sward editor ASTM Special Technical Publication 500, p 283. The test is repeated 3 times and Table 4 shows the obtained results, which are given as the grade of the hardest pencil that leaves a trace on the tested film.

EXAMPLE 38-44

Pencil Hardness Test of the F2-F8 Films

Films F2-F8 obtained in examples 14-20 on a chrome aluminium substrate are subjected to the pencil hardness test according to the procedure described in example 37. Table 4 shows the obtained results.

COMPARATIVE EXAMPLE 12

Pencil Hardness Test of the CF9 Film

Film CF9 obtained on in comparative example 1 on a chrome aluminium substrate is subjected to the pencil hardness test according to the procedure described in example 37. Table 4 shows the obtained results as the grade of the hardest pencil that leaves a trace on the tested film.

COMPARATIVE EXAMPLE 13

Pencil Hardness Test of the CF10 film

Film CF10 obtained on in comparative example 3 on a chrome aluminium substrate is subjected to the pencil hardness test according to the procedure described in example 37. Table 4 shows the obtained results as the grade of the hardest pencil that leaves a trace on the tested film.

TABLE 4

| Tested Films | | | |
|---|---|---|---|
| Test Example | Composition | Film | Pencil hardness |
| Ex. 37 | C1 | Film* F1 | 2H |
| Ex. 38 | C2 | Film* F2 | H |
| Ex. 39 | C3 | Film* F3 | 2H |
| Ex. 40 | C4 | Film* F4 | 4H |
| Ex. 41 | C5 | Film* F5 | H |
| Ex. 42 | C6 | Film* F6 | 6H |
| Ex. 43 | C7 | Film* F7 | 8H |
| Ex. 44 | C8 | Film* F8 | 6H |
| Comp. Ex. 12 | Comp. C9 | Film* CF9 | 6B |
| Comp. Ex. 13 | Comp. C10 | Film* CF10 | 2B |

*= 30 μm

The results of the pencil hardness tests show that the inventive films F1-F8 have a higher hardness than the comparative films.

EXAMPLE 45

Water Contact Angle Measurement of Film F1

Film F1, obtained in example 13 on a chrome aluminium substrate, was subjected to measurement of the water contact angle by means of apparatus DSA G10 Kruss, according to method ASTM D5725-99-2003. Table 5 shows the obtained value.

EXAMPLE 46-52

Water Contact Angle Measurement of Films F2-F8

Films F2-F8, obtained in example 14-20 on a chrome aluminium substrate, were subjected to measurement of the water contact angle by means of apparatus DSA G10 Kruss, according to method ASTM D5725-99-2003. Table 5 shows the obtained values.

TABLE 5

| Tested films | | θ H₂O |
|---|---|---|
| Example 45 | Film* F1 | 105 ± 1 |
| Example 46 | Film* F2 | 106 ± 3 |
| Example 47 | Film* F3 | 106 ± 3 |
| Example 48 | Film* F4 | 100 ± 2 |
| Example 49 | Film* F5 | 106 ± 3 |
| Example 50 | Film* F6 | 108 ± 2 |
| Example 51 | Film* F7 | 105 ± 3 |
| Example 52 | Film* F8 | 100 ± 2 |

*= 30 μm

The test results show that the protective films according to the invention have good hydrophobic properties and are therefore suitable to act as a moisture barrier for solar cell modules.

The invention claimed is:

1. A solar module comprising a protective film comprising at least one layer comprising a perfluoropolyether (PFPE) polymer [polymer (F)], said polymer obtained by cross-linking a composition (C) comprising:
   a) at least one functional perfluoropolyether compound [compound (E)], said compound (E) comprising a (per)fluoropolyoxyalkylene chain [chain ($R_f$)], and at least one unsaturated moiety, said compound (E) being present in an amount in the range of 10% to 95% wt with respect to composition (C);
   b) at least one nonfluorinated compound [compound (M)] having at least one unsaturated moiety, wherein said nonfluorinated compound (M) comprises at least two unsaturated moieties if compound (E) comprises only one unsaturated moiety; and
   c) at least one crosslinking initiator.

2. The solar cell module according to claim 1, wherein said compound (E) is present in an amount in the range of 20% to 85% wt with respect to said composition (C).

3. The solar cell module according to claim 1, wherein said compound (E) is present in an amount in the range of 30% to 75% wt with respect to said composition (C).

4. The solar cell module according to claim 1, wherein said compound (E) is selected from the group consisting of compounds of formula $$(T_1)_n\text{-}J\text{-}R_f\text{-}J'(T_2)_m$$

wherein $R_f$ represents a (per)fluoropolyoxyalkylene chain; J and J', equal to or different from each other, are independently a bond or a divalent or polyvalent bonding group; n, m are integers from 1 to 3; and $T_1$, $T_2$, equal to or different from each other, are selected from the group consisting of:

$$—OCO—CR_H=CH_2 \quad (A)$$

$$—OCO—NH—CO—CR_H=CH_2, \quad (B)$$

and $$—OCO—R_A—CR_H=CH_2 \quad (C)$$

wherein $R_H$ is H or a $C_1$-$C_6$ alkyl group, $R^A$ is selected from the group consisting of:

$$—NH—R^B—OCO—, \quad (j)$$

and $$—NH—R^B—NHCOO—R^{B'}—OCO— \quad (jj)$$

said $R^B$, $R^{B'}$, equal to or different from each other, being independently divalent or polyvalent bonding groups selected from the group consisting of $C_1$-$C_{20}$ aliphatic group, $C_5$-$C_{40}$ cycloaliphatic group, $C_6$-$C_{50}$ aromatic group, $C_6$-$C_{50}$ alkylaromatic group, and $C_6$-$C_{50}$ heteroaromatic group.

5. The solar cell module according to claim 4, wherein said chain $R_f$ complies with formula:

$$—(CF_2O)_p(CF_2CF_2O)_q(CFYO)_r(CF_2CFYO)_s—(CF_2(CF_2)_zCF_2O)_t—$$

wherein Y is a $C_1$-$C_5$ perfluoro(oxy)alkyl group, z is 1 or 2; and p, q, r, s, t are integers ≥0, selected such that the molecular weight of said chain $R_f$ is more than 500 and less than 4000.

6. The solar cell module according to claim 1, wherein said compound (E) is selected from the group consisting of:
   (1) acrylate derivatives of formula:

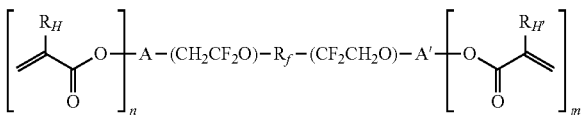

wherein n and m are integers from 1 to 3; A and A', equal to or different from each other, are independently a bond or a divalent, trivalent or tetravalent bonding group; $R_f$ represents said chain and $R_H$, $R_{H'}$, equal to or different from each other, are independently H or a $C_1$-$C_6$ alkyl group;

(2) acrylamide-urea derivatives of formula:

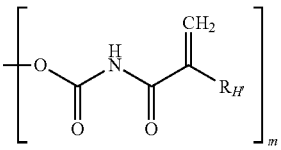

wherein n and m, A and A', $R_f$, $R_H$, $R_{H'}$ and $R_f$ have the same meaning as above detailed;

(3) acrylate-urethane derivatives of formula:

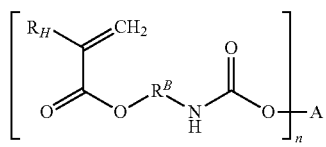 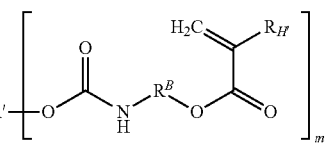

wherein n and m, A and A', $R_f$, $R_H$, $R_{H'}$ have the same meaning as above detailed; and each of $R^B$, equal to or different from each other, is a divalent, trivalent or tetravalent group selected from the group consisting of $C_1$-$C_{20}$ aliphatic group, $C_5$-$C_{40}$ cycloaliphatic group, $C_6$-$C_{50}$ aromatic group, $C_6$-$C_{50}$ alkylaromatic group, and $C_6$-$C_{50}$ heteroaromatic group; and (4) urethane-amide-acrylate derivatives of formula:

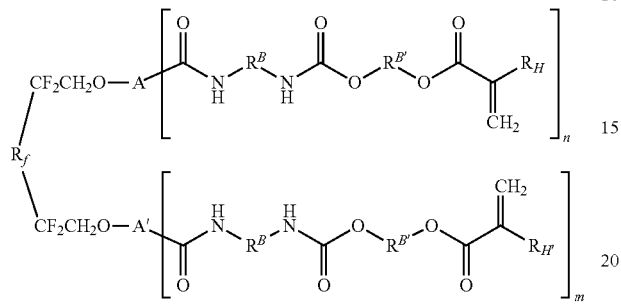

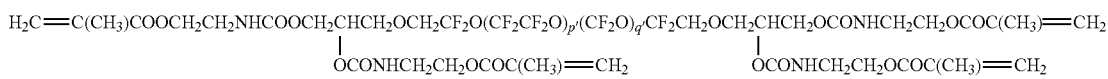

wherein n and m, A and A', $R_f$, $R_H$, $R_{H'}$, $R^B$ have the same meaning as above detailed; and each of $R^{B'}$, equal to or different from each other, is a divalent, trivalent or tetravalent group selected from the group consisting of $C_1$-$C_{20}$ aliphatic group, $C_5$-$C_{40}$ cycloaliphatic group, $C_6$-$C_{50}$ aromatic group, $C_6$-$C_{50}$ alkylaromatic group, and $C_6$-$C_{50}$ heteroaromatic group.

7. The solar cell module according to claim 6, wherein said compound (E) is a compound of formula:

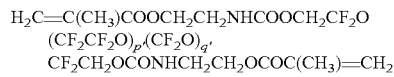

wherein p' and q' are selected so that the molecular weight of said chain $R_f$ is more than 500 and less than 4000.

8. The solar cell module according to claim 6, wherein said compound (E) is a compound of formula:

wherein p' and q' are selected so that the molecular weight of said chain $R_f$ is more than 500 and less than 4000.

9. The solar cell module according to claim 6, wherein said compound (E) is a compound of formula:

wherein $R_f$ is a —$CF_2O(CF_2CF_2O)_{p'}(CF_2O)_{q'}CF_2$— chain, wherein p' and q' are selected so that the molecular weight of said chain $R_f$ is more than 500 and less than 4000.

10. The solar cell module according to claim 6, wherein said compound (E) is a compound of formula:

A-NHCOOCH$_2$CF$_2$(CF$_2$O)$_{p'}$(CF$_2$CF$_2$O)$_{q'}$CF$_2$CH$_2$OCONH-A wherein:

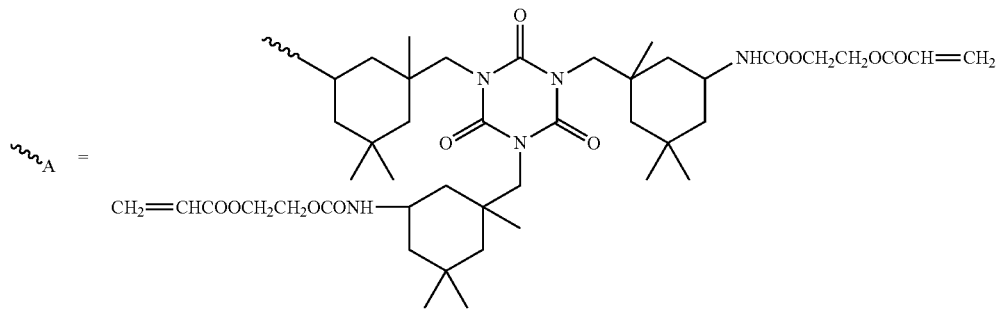

and p' and q' are selected so that the molecular weight of said chain $R_f$ is more than 500 and less than 4000.

11. The solar cell module according to claim 1, wherein said at least one compound (M) comprises one or more of (meth)acryloyl functions.

12. The solar cell module according to claim 1, wherein said crosslinking initiator is a photo initiator selected from the group consisting of following families:
- alpha-hydroxyketones;
- phenylglyoxylates;
- benzyldimethyl-ketals;
- alpha-aminoketones; and
- bis acyl-phosphines.

13. A process for manufacturing a protective film for a solar cell module, said process comprising the steps of:
  (a) providing a composition (C) comprising:
    a) at least one functional perfluoropolyether compound [compound (E)], said compound (E) comprising a (per)fluoropolyoxyalkylene chain [chain ($R_f$)], and at least one unsaturated moiety, said compound (E) being present in an amount in the range of 10% to 95% wt with respect to composition (C);
    b) at least one nonfluorinated compound [compound (M)] having at least one unsaturated moiety, wherein said nonfluorinated compound (M) comprises at least two unsaturated moieties if compound (E) comprises only one unsaturated moiety; and
    c) at least one crosslinking initiator;
  (b) depositing said composition (C) on the surface of a photovoltaic element which is to be protected, and
  (c) crosslinking said composition (C).

14. A method for protecting a solar cell module, comprising using a protective film comprising at least one layer comprising a perfluoropolyether (PFPE) polymer [polymer (F)], said polymer being obtained by cross-linking a composition (C) comprising:
  a) at least one functional perfluoropolyether compound [compound (E)], said compound (E) comprising a (per)fluoropolyoxyalkylene chain [chain ($R_f$)], and at least one unsaturated moiety, said compound (E) being present in an amount in the range of 10% to 95% wt with respect to composition (C);
  b) at least one nonfluorinated compound [compound (M)] having at least one unsaturated moiety, wherein said nonfluorinated compound (M) comprises at least two unsaturated moieties if compound (E) comprises only one unsaturated moiety; and
  c) at least one crosslinking initiator.

\* \* \* \* \*